(12) United States Patent
Kim et al.

(10) Patent No.: US 6,497,969 B2
(45) Date of Patent: *Dec. 24, 2002

(54) ELECTROLUMINESCENT DEVICE HAVING AN ORGANIC LAYER INCLUDING POLYIMIDE

(75) Inventors: Youngkyoo Kim, Pusan (KR); Jae-Gyoung Lee, Seongnam-shi (KR)

(73) Assignee: Nessdisplay Co., Ltd., Suwon-si (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/128,853

(22) Filed: Aug. 4, 1998

(65) Prior Publication Data

US 2002/0132133 A1 Sep. 19, 2002

(30) Foreign Application Priority Data

| Sep. 5, 1997 | (KR) | 97-45959 |
|---|---|---|
| Oct. 10, 1997 | (KR) | 97-52095 |
| Oct. 10, 1997 | (KR) | 97-52096 |
| Oct. 10, 1997 | (KR) | 97-52100 |
| Oct. 10, 1997 | (KR) | 97-52103 |
| Dec. 26, 1997 | (KR) | 97-74294 |
| Dec. 26, 1997 | (KR) | 97-74295 |
| Dec. 26, 1997 | (KR) | 97-74296 |
| Dec. 26, 1997 | (KR) | 97-74299 |
| Dec. 26, 1997 | (KR) | 97-74300 |

(51) Int. Cl.$^7$ ................................ H05B 33/12
(52) U.S. Cl. ............... 428/690; 428/917; 428/473.5; 313/502; 313/504; 313/506; 313/509
(58) Field of Search ............... 428/690, 917, 428/413, 414, 473.5; 313/502, 504, 506, 509; 528/310, 322, 323, 324, 329.1, 335, 344, 348, 361

(56) References Cited

U.S. PATENT DOCUMENTS

| 4,123,269 A | | 10/1978 | Von Hoene et al. | |
|---|---|---|---|---|
| 4,356,429 A | * | 10/1982 | Tang | 313/503 |
| 5,262,379 A | * | 11/1993 | Bailey et al. | 503/227 |
| 5,281,489 A | * | 1/1994 | Mori et al. | 428/690 |
| 5,331,182 A | * | 7/1994 | Takimoto et al. | 257/40 |
| 5,443,921 A | * | 8/1995 | Hosokawa et al. | 428/690 |
| 5,821,003 A | * | 10/1998 | Uemura et al. | 428/690 |
| 6,037,712 A | * | 3/2000 | Codama et al. | 313/498 |

FOREIGN PATENT DOCUMENTS

| JP | 58032372 | 7/1983 |
|---|---|---|
| JP | 3274693 | 12/1991 |
| JP | 4073886 | 3/1992 |
| JP | 4093389 | 3/1992 |
| JP | 7147189 | 6/1995 |
| JP | 7230881 | 8/1995 |
| JP | 8069878 | 3/1996 |
| JP | 9104679 | 4/1997 |
| JP | 9153641 | 6/1997 |

OTHER PUBLICATIONS

Jae–Gyoung Lee et al., "Light–Emitting Diode Based on Oligo–Phenylene Vinylene and Butyl–PBD Blends", Solid State Communications, vol. 102, No. 12, pp. 895–898, Jun. 1997.*

Jae–Gyoung Lee et al., "Mixing effect of chelate complex and metal in organic light–emitting diodes", Applied Physics Letters, vol. 72, No. 14, pp. 1757–1759, Apr. 06, 1998.*

Eugene I. Maltsev, et al.; Aromatic Polyimides as Efficient Materials for Organic Electroluminescent Devices; Polymer International vol. 42, No. 4, Apr. 1997.

* cited by examiner

*Primary Examiner*—Marie Yamnitzky
(74) *Attorney, Agent, or Firm*—Jacobson Holman PLLC

(57) ABSTRACT

An electroluminescent device comprising a transparent electrode layer, a metallic electrode layer, and an organic interlayer disposed between, and in close contact with, the electrode layers wherein the organic interlayer is comprised of an organic luminescent layer, an optional hole transport layer and an optional electron transport layer, and contains a polyimide of formula (I):

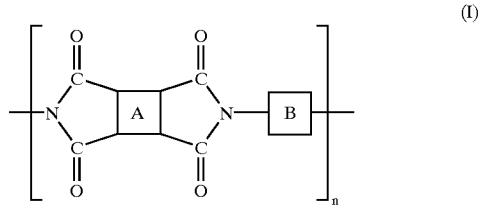

wherein A is a moiety derived from a dianhydride compound; B is a moiety derived from a diamine compound; and n is an integer of 2 or higher.

12 Claims, 4 Drawing Sheets

ELECTROLUMINESCENT DEVICE HAVING AN ORGANIC LAYER INCLUDING POLYIMIDE

FIELD OF THE INVENTION

The present invention is directed to an electroluminescent device; and, more particularly, to an organoelectroluminescent device having an improved luminous efficiency, good stability and prolonged lifetime, wherein the organic layer comprises a polyimide thin film having an emission and/or carrier transport capability.

BACKGROUND OF THE INVENTION

Generally, an electroluminescent device has a laminated structure comprising a transparent electrode layer, a metallic electrode layer and an organic interlayer including an organic luminescent layer arranged between the two electrodes. The electroluminescent device can be operated with an alternate current(AC) or direct current(DC) power supply. In case of DC operation, the transparent electrode functions as an anode, and the metallic electrode as a cathode. In order to increase the luminous efficiency, the organic interlayer may further include hole transport agents and electron transport agents, often in a multilayer configuration.

For example, in case of DC operation, a separate hole transport layer may be disposed between, and in close contact with, the anode layer and one surface of the organic luminescent layer. Further, an optional electron transport layer may be placed between the cathode layer and the organic luminescent layer. Depending on the organic materials employed, therefore, the organic interlayer of an electroluminescent device may be in the form of a single, double or triple layers, each layer containing various combinations of organic luminescent materials, hole transport agents and electron transport agents. As the anode layer, indium tin oxide-glass layer is usually used while a metallic layer of magnesium, aluminum, indium or silver-magnesium can be used as the cathode. In conventional electroluminescent devices, the organic layers are usually formed by vapor-depositing the organic materials.

However, an organic layer, e.g., a hole transport layer, prepared by a conventional vacuum deposition method of small molecules has the disadvantages in that the deposited organic layer is fragile, easily broken by a vibrational shock, and the lifetime of the device is short due to the occurrence of crystallization and diffusion migration phenomena during use. In order to solve the above problems, an organic layer has been prepared by dispersing active agents, e.g., a hole transport agent and organic luminescent material, in a polymer matrix such as polymethylmethacrylate (PMMA) having a glass transition temperature of 105° C., polycarbonate having a glass transition temperature of 145° C., or other vinylic polymers having a glass transition temperature of 150° C. or lower. However, these polymers have a low heat stability and thus the stability of the resultant organic layer is unsatisfactory(see Kido et al., *Appl. Phys. Lett.*, 61, No. 7, 171, 1992; and *Jpn. J. Appl. Phys.*, 31, No. 78, L960, 1992).

U.S. Pat. Nos. 5,609,970, 5,571,626, 5,414,069 and 5,376,456, on the other hand, disclose certain electroluminescent polymers. However, the preparation of these special polymers entails high production costs and complicated processing steps and thus are not suitable for the mass production of electroluminescent devices.

Polyimides have been widely used in the electronic and electrical fields. For example, it has been reported that polyimides may be used in packaging an electroluminescent device or as an insulating layer in electroluminescent devices (see U.S. Pat. Nos. 5,505,985 and 5,416,622). Further, Japanese Laid-Open Publication No. 4-93389 suggests that a polyimide film can be used as a carrier(hole) transport layer. However, the hole transport ability of a polyimide layer is too low for practical use. Japanese Laid-Open Publication No. 7-230881 discloses that a thermally decomposed silicon-containing polyimide exhibits a hole transporting ability, the thermally decomposed polyimide being prepared by heat treating a polyimide at a temperature ranging from 500° C. to 1,000° C. However, the turn-on voltage of the final device remains still too high.

Therefore, there has existed a need to develop a low-cost electroluminescent device having an improved stability and luminous efficiency.

SUMMARY OF THE INVENTION

Accordingly, it is an object of the present invention to provide an electroluminescent device having good thermal and mechanical properties, improved stability and prolonged lifetime.

In accordance with the present invention, there is provided an electroluminescent device comprising a transparent electrode layer, a metallic electrode layer, and an organic interlayer disposed between, and in close contact with, the electrode layers wherein the organic interlayer is comprised of an organic luminescent layer, an optional hole transport layer and an optional electron transport layer, and contains a polyimide of formula (I):

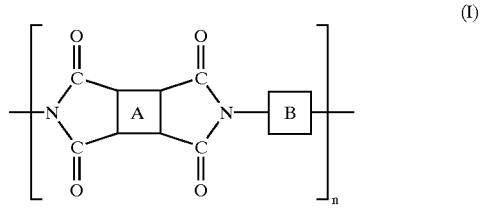

wherein A is a moiety derived from a dianhydride compound; B is a moiety derived from a diamine compound; and n is an integer of 2 or higher.

In accordance with one aspect of the present invention, there is provided an electroluminescent device comprising a transparent anode layer, a metallic cathode layer, an organic luminescent layer containing an electroluminescent material and a hole transport layer, the organic luminescent layer being disposed between, and in close contact with, the cathode layer and one surface of the hole transport layer, and the other surface of the hole transport layer being in close contact with the anode layer, wherein the hole transport layer contains a hole transport agent dispersed in a polyimide matrix.

In accordance with another aspect of the present invention, there is provided an electroluminescent device comprising a transparent anode layer, a cathode layer and an organic luminescent layer containing an electroluminescent material, the electroluminescent layer being disposed between, and in close contact with, the anode and the cathode layers, wherein the electroluminescent material is dispersed in a polyimide matrix.

BRIEF DESCRIPTION OF THE DRAWINGS

The above and other objects and features of the present invention will become apparent from the following descrip

DETAILED DESCRIPTION OF THE INVENTION

Figure 1:
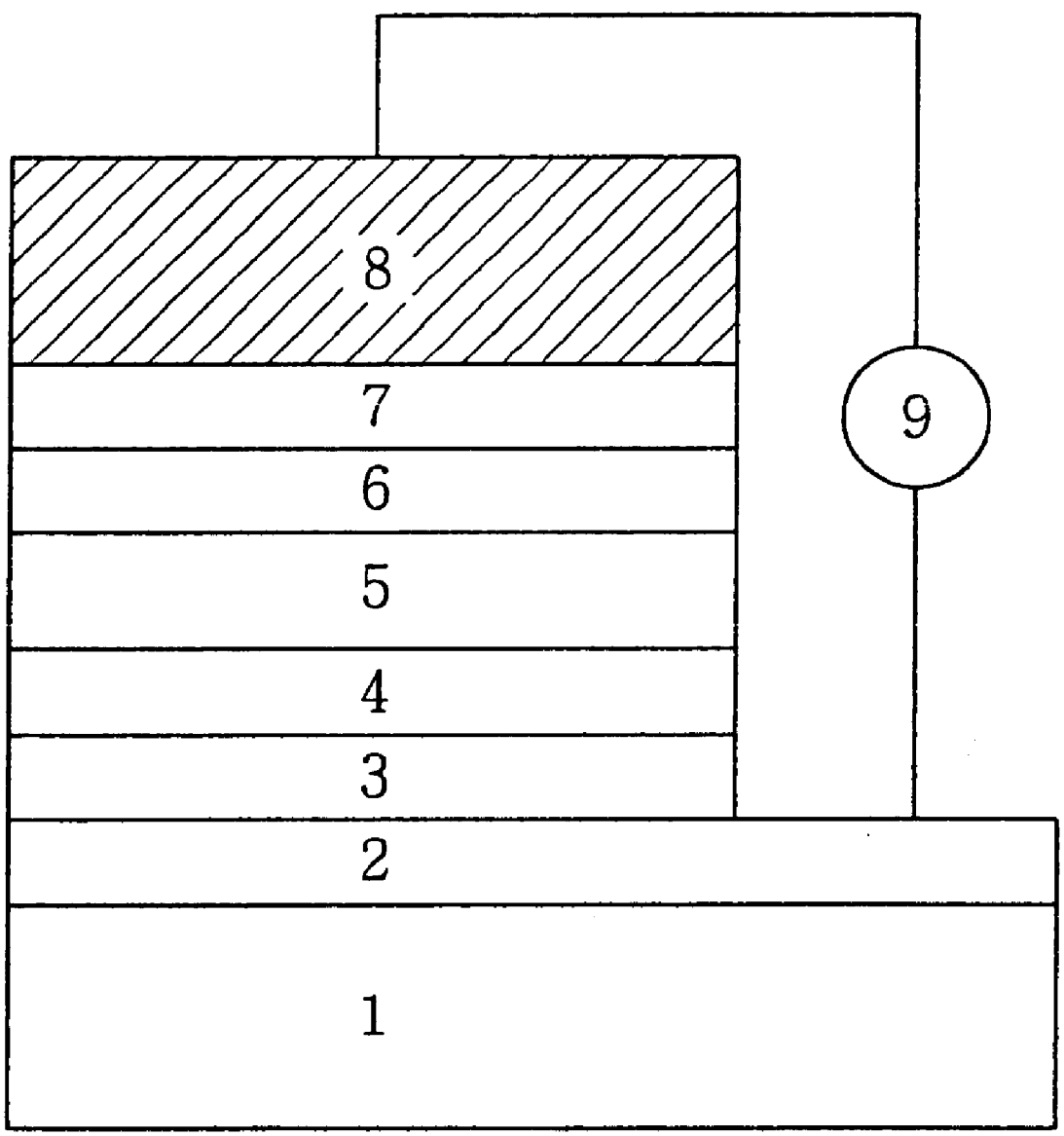
- FIG. 1 shows a schematic diagram of an electroluminescent device in accordance with one embodiment of the present invention.

The electroluminescent device in accordance with one aspect of the present invention comprises a transparent electrode layer prepared by etching an ITO(indium tin oxide) layer coated on a transparent substrate such as glass in accordance with a predetermined pattern, a metallic electrode layer of aluminum, magnesium, calcium, silver or other metal as well as a metal alloy, and an organic interlayer including an organic luminescent layer disposed between, and in close contact with, the transparent electrode layer and the metallic electrode layer. The electroluminescent device of the present invention can be operated with an alternate current(AC) or direct current(DC) power source. In case of DC operation, the transparent electrode functions as an anode, and the metallic electrode as a cathode.

The organic interlayer may further include a hole transport layer sandwiched between the transparent electrode layer and the organic luminescent layer. The organic interlayer may still further include an electron transport layer inserted between the metallic electrode layer and the organic luminescent layer.

The organic interlayer can thus be made in the form of a single layer or multiple layers depending on the desired combination of the organic luminescent, the hole transport and the electron transport agents. For example, the organic interlayer may be in the form of double layers consisting of a hole transport/organic luminescent layer and an electron transport layer, or consisting of a hole transport layer and an organic luminescent/electron transport layer. The organic interlayer may also be in the form of triple layers consisting of a hole transport layer, an organic luminescent layer and an electron transport layer.

The critical feature of the present invention resides in the use of a polyimide of formula (I) in at least one layer of the organic interlayer.

The polyimide of formula(I) may exhibit hole transporting, light emitting or electron transporting ability in case when either of the moieties A and B possesses a functional group capable of hole transporting, light emitting or electron transporting.

Exemplary polyimides which may be used in the present invention include an insoluble polyimide derived by heat treating a polyimide precursor and a soluble polyimide such as a polyetherimide of formula (II) having a glass transition temperature of 220° C. or higher and a molecular weight of 40,000 or more.

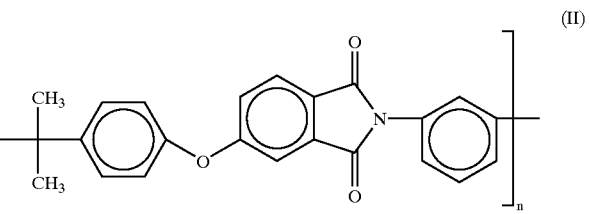

(II)

wherein, n is an integer of 2 or higher.

The polyimide precursor which can be used in the present invention includes a poly(amic acid) of formula(III) or its derivatives obtained by treating a mixture of a dianhydride of formula(IV) and a diamine of formula(V) at a temperature ranging from 0 to 60° C. for a period ranging from 24 to 48 hours in a solvent such as N-methyl-2-pyrrolidone, dimethylacetamide, tetrahydrofuran, dimethylformamide and dimethylsulfoxide.

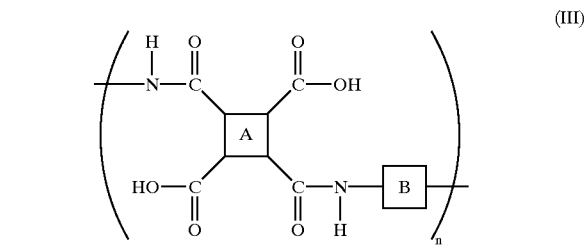

(III)

(IV)

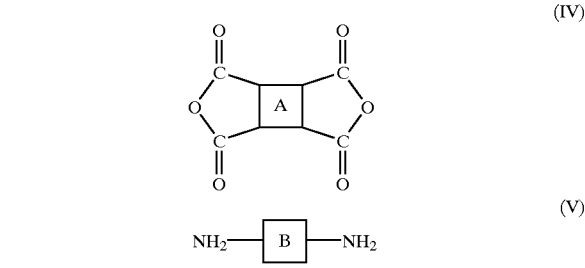

(V)

wherein A, B and n have the same meanings as defined above.

Further, a polyamic dialkylester of formula(VI), a covalent type photosensitive polyimide precursor of formula (VII), and an ionic type photosensitive polyimide precursor of formula(VIII) may also be used. The polyimide precursor can be converted to the corresponding polyimide of formula (I) by thermal imidization at a temperature ranging from 100 to 600° C. or by UV irradiation:

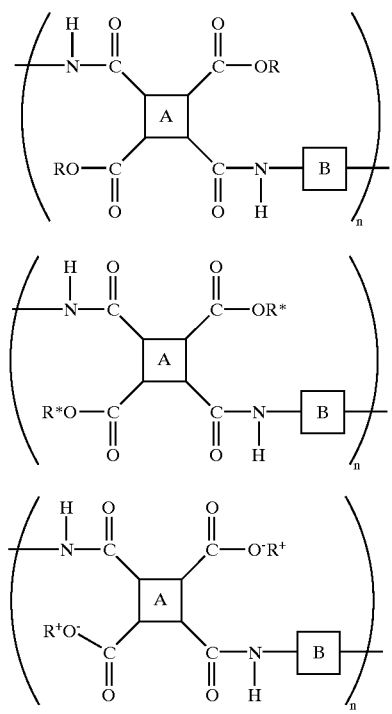

wherein,

A, B and n have the same meanings as defined above;

R is an alkyl group;

R* is a covalent type photosensitive group such as ·CH$_2$CH$_2$OC(=O)CH=CH$_2$; and R$^+$ is an ionic type photosensitive group such as $^+$NH(CH$_3$)$_2$—CH$_2$CH$_2$OC(=O)CH=CH—C$_6$H$_4$—N$_3$.

Exemplary dianhydrides of formula(IV) include pyromellitic dianhydride, 3,4,3',4'-biphenyltetracarboxylic dianhydride, 3,3',4,4'-benzophenone tetracarboxylic dianhydride, 4,4'-(hexafluoropropylidene)diphthalic anhydride, 4,4'-(dimethylsilicon)diphthalic anhydride, 4,4'-oxydiphthalic anhydride, 3,3',4,4'-diphenylsulfone tetracarboxylic dianhydride, 1,2,3,4-cyclopentane tetracarboxylic dianhydride, naphthalene-1,4,5,8-tetracarboxylic dianhydride, 3,4,9,10-perylene tetracarboxylic dianhydride, 4-(2,5-dioxotetrahydrofuran-3-yl)tetralin-1,2-dicarboxylic anhydride, 5-(2,5-dioxotetrahydrofuryl)-3-methyl-3-cyclohexene-1,2-dicarboxylic anhydride, bicyclo[2,2,2]oct-7-ene-2,3,5,6-tetracarboxylic dianhydride, 2,2'-di-tert-butylbiphenyl-bis(etherphthalic anhydride), 2,5-di-tert-butylphenyl-bis(etherphthalic anhydride) and bisphenol A-bis(etherphthalic anhydride). The structures of A in the polyimide of formula(I) derived from the above dianhydride are as follows:

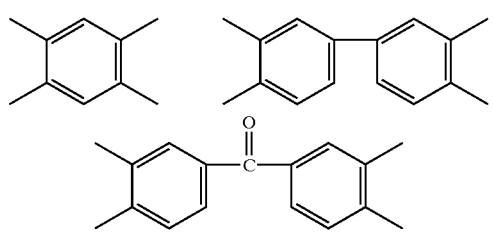

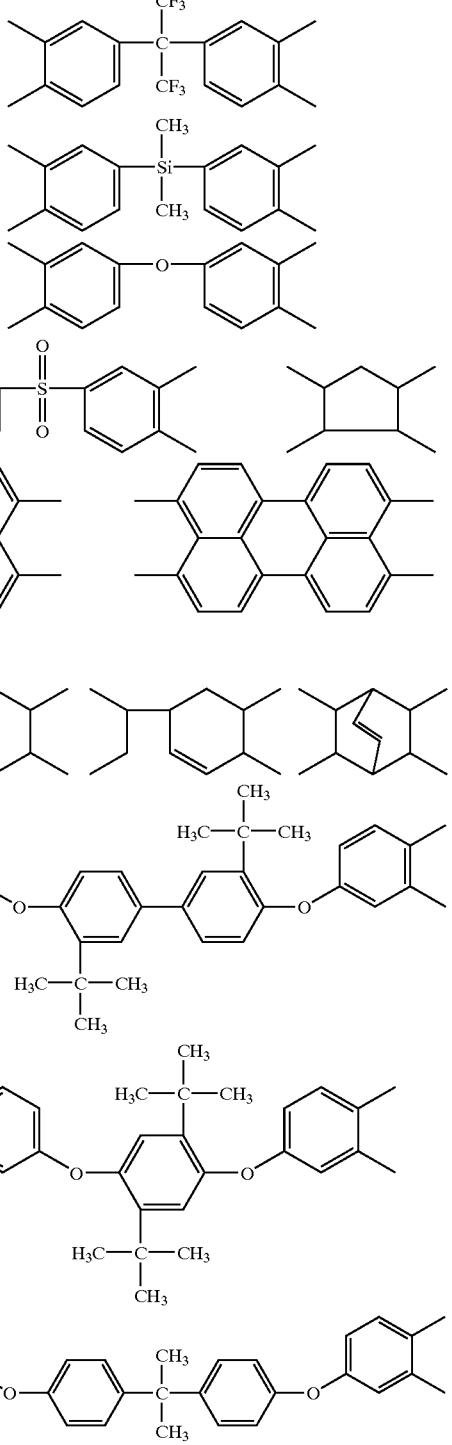

Representative diamines of formula(V) include 4,4'-diaminodiphenylether, 4,4'-diaminodiphenylmethane, 2,2-bis(4-aminophenyl)propane, 3,5-diaminotoluene, 3,4'-diaminodiphenylether, 3,4'-diaminodiphenylmethane, 1,4-phenylene diamine, 1,3-phenylene diamine, 3,3'-diaminodiphenylether, 3,3'-diaminodiphenylmethane, 2,5-dimethyl-p-phenylene diamine, 2,3,5,6-tetramethyl-p-phenylene diamine, diaminofluorene, diaminofluorenone, 4,4'-diaminobenzophenone, 4,4'-diaminobiphenyl, 3,3'-diaminobenzophenone, 4,4'-diaminodiphenylsulfide, α,α'- bis(4-aminophenyl)-1,4-diisopropylbenzene, 2,2-bis[4-(4-aminophenoxy)phenyl]propane,1,4-bis(4-aminophenoxy)benzene, 2,2-bis[4-(3-aminophenoxy)phenyl]hexafluoropropane, 2,6-diaminotoluene, mesitylene diamine, 4,4'-diaminodiphenyl-sulfone, 3,3'-diaminodiphenylsulfone, 3,3'-bis(aminophenyl)-hexafluoropropane, 2,2-bis(3-amino-4-hydroxylphenyl)hexa-fluoropropane, 4,4'-bis(2-chloroanilino)methane, 4,4'-bis(aminocyclohexyl)methane, 2,2'-bis(3-amino-4-methylphenyl)hexafluoropropane, 3,4'-diaminobenzophenone, 4,4'-diaminobibenzyl, 4,4'-bis(aminophenyl)hexafluoropropane, 1,3'-bis(m-aminophenoxy)benzene, 4,4'-methylene-bis-o-toluidine, 3,3'-diamino-4,4'-dihydroxybiphenyl, 4,4'-diaminooctafluorodiphenyl, 4,4'-bis(aminophenyl)selenide, 9,10-bis(3-amino-phenylthio)-anthracene, 9,10-bis(4-aminophenylthio)-anthracene, 9,10-bis(3-aminoanilino)-anthracene, 9,10-bis(4-aminoanilino)anthracene, acridine yellow G, acriflavine, 3,6-diaminoacridine, 6,9-diamino-2-ethoxyacridine, basic fuchsin, methylated basic fuchsin, 2,4-diamino-6-phenyl-1,3,5-triazine, 9,10-diaminophen-anthrene, 3,8-diamino-6-phenylphenanthridine, dimidium bromide, ethidium bromide, propidium iodide, thionin, 3,7-diamino-5-phenylphenazium chloride and 3,3'-dimethylnaphthidine. The structures of B in the polyimide of formula(I) derived from the above diamines are as follows:

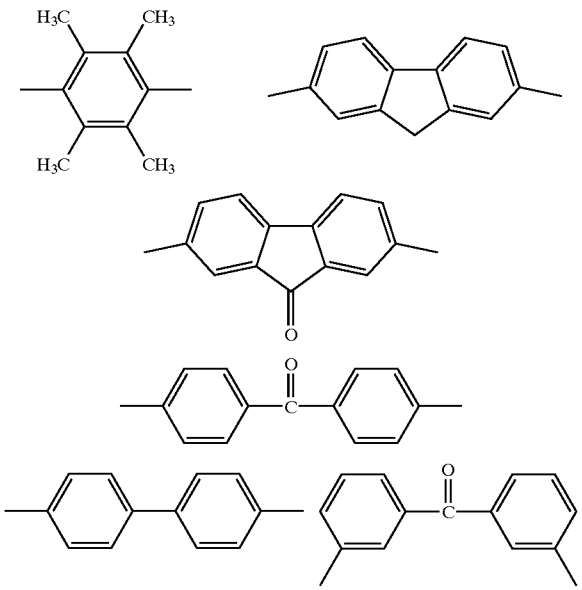
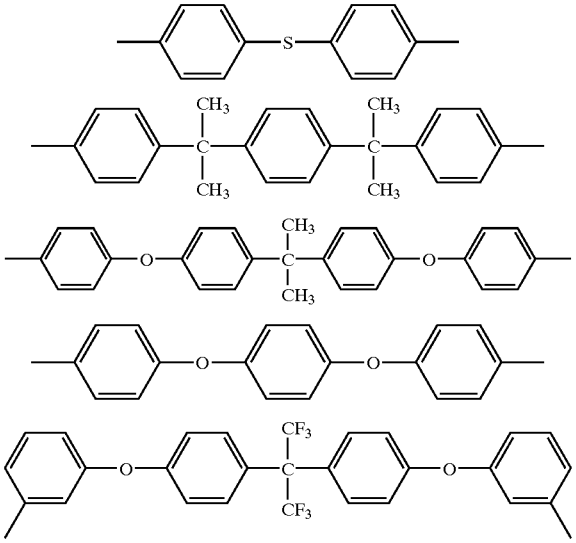
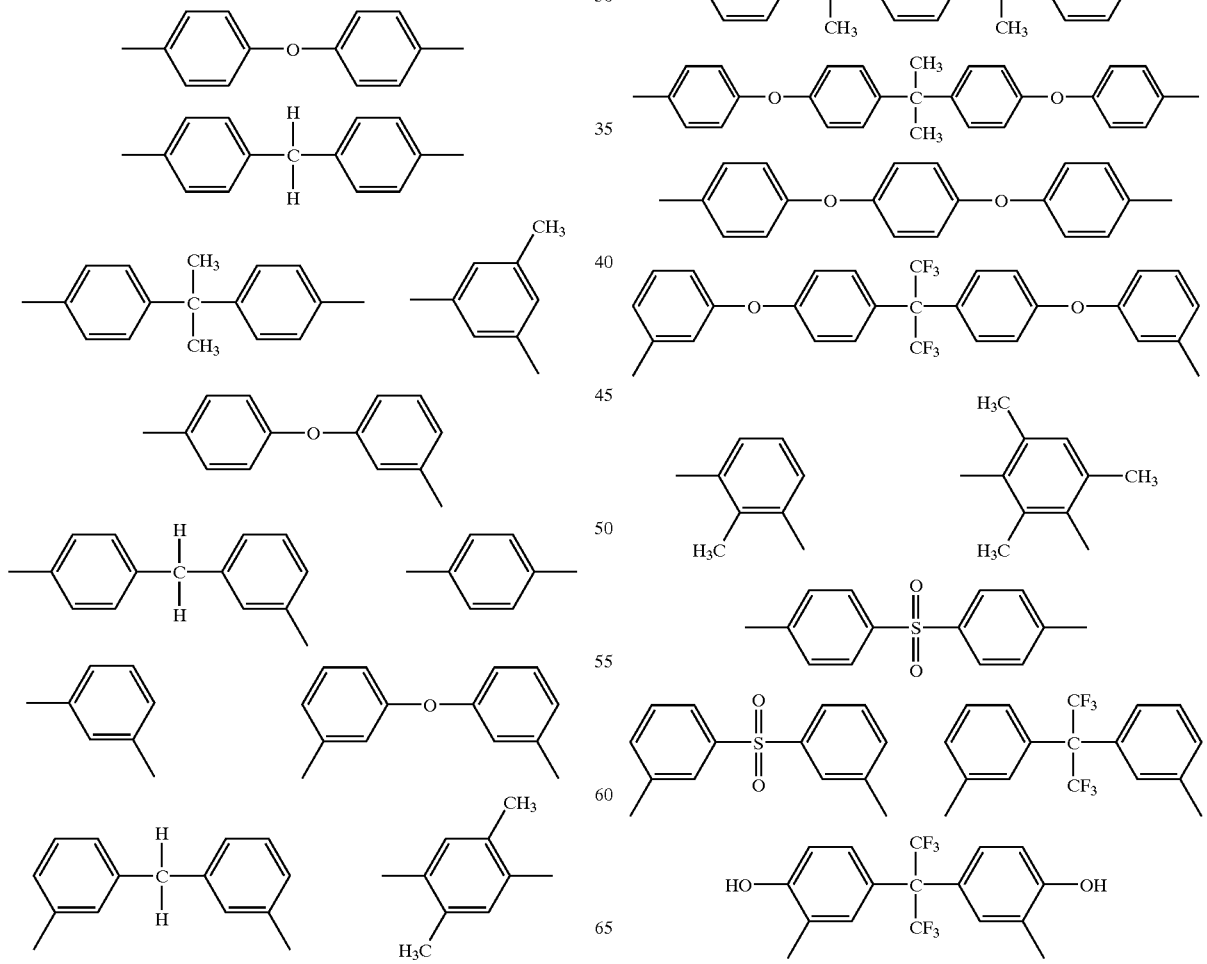
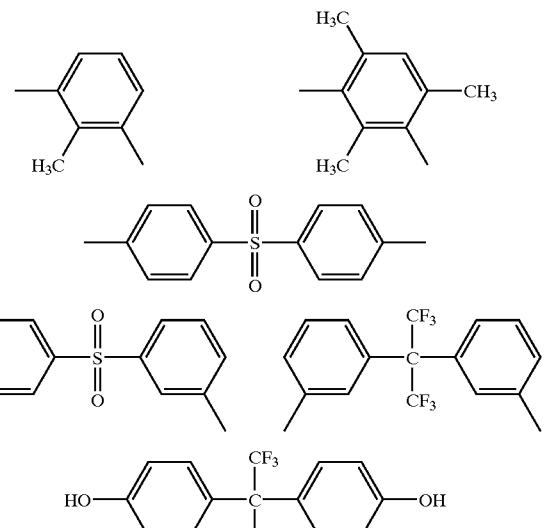

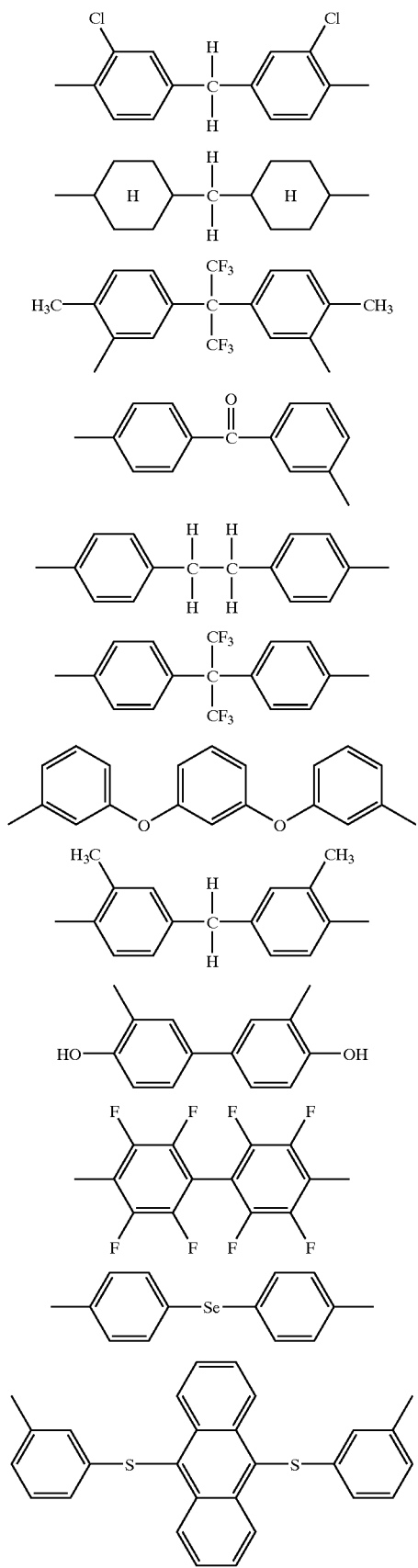
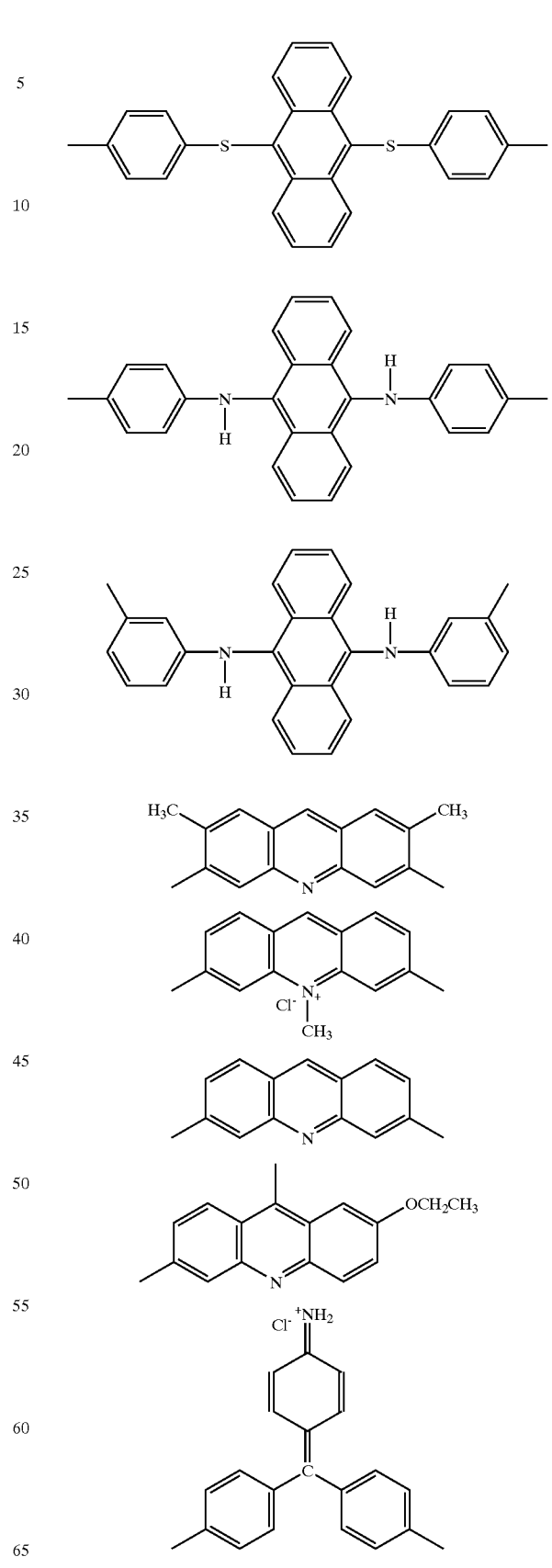

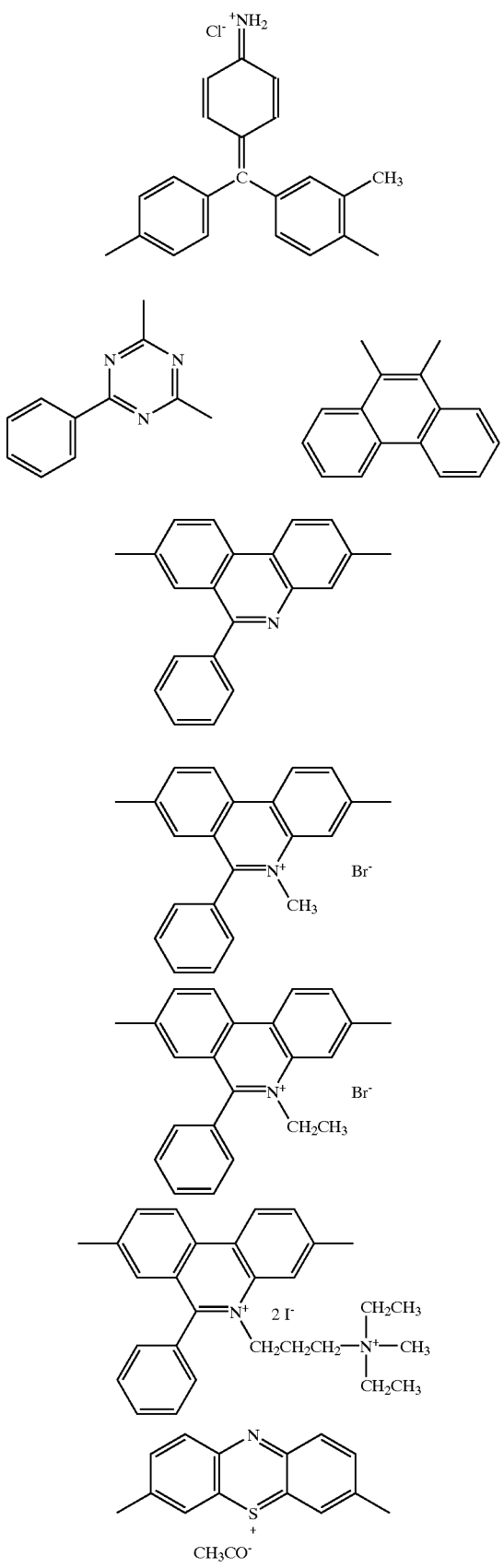

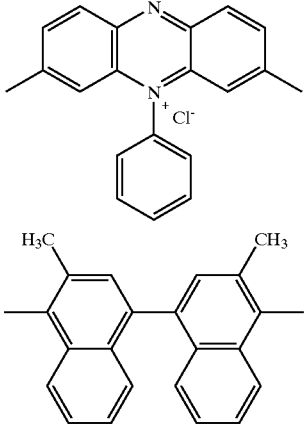

Hole Transport Layer

The hole transport layer of the present invention comprises a polyimide of formula(I) having a moiety capable of hole transporting, or a mixture of a polyimide of formula(I) with a conventional hole transport agent such as nitrogen-containing material. Exemplary hole transport agents include secondary amines and tertiary amines such as N,N'-diphenyl-N,N'-bis(3-methylphenyl)-1,1'-diphenyl-4,4-diamine(TPD) and poly(N-vinylcarbazole), among which TPD is preferred.

In case a hole transport agent is dispersed in a polyetherimide of formula(II), the weight ratio of polyetherimide (PEI):hole transport agent ranges from 90:10 to 10:90, preferably 50:50. When the weight ratio is less than 90:10, the hole transporting and electron confining abilities of the device become lower and when the weight ratio is more than 10:90, the surface uniformity of the hole transport layer becomes unsatisfactory. A suitable mixture of PEI and a hole transport agent is dispersed in a solvent to a concentration ranging from 0.3 to 10 wt % to form a coating solution, wherein the solvent can be selected from the group consisting of chloroform, methylene chloride, dichloromethane, dimethylformamide, dimethylacetamide, N-methyl-2-pyrrolidone, tetrahydrofuran and a mixture thereof.

The PEI/hole transport agent coating solution thus prepared is coated on a transparent electrode layer by a conventional wet process such as spin coating, doctor blading and screen printing. For example, the solution is coated on an ITO anode at 500 to 8,000 rpm for 1 to 5 minutes, and then, the resulting coating layer is dried at 30 to 100° C. for 1 minute to 1 hour.

In accordance with one aspect of the present invention, a polymeric hole transport agent may also be used. For example, a doped polyaniline prepared by doping polyaniline-emeraldine base of formula(IX) with an acid may be used with a polyimide to form a stable hole transport layer.

(IX)

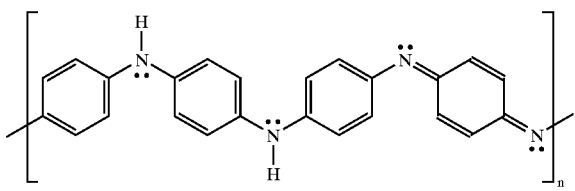

wherein, n is an integer of 2 or higher.

Solvents such as chloroform, N-methyl-2-pyrrolidone, dimethylacetamide, dimethylformamide, dimethylsulfoxide, and tetrahydrofuran may be used in the process of doping polyaniline-emeraldine base with an acid such as dodecylbenzenesulfonic acid, camphorsulfonic acid((+) and (−) form), benzenesulfonic acid, p-toluenesulfonic acid, 5-sulfosalicylic acid and the like. An acid doped polyaniline has a typical repeating unit of formula(X).

(X)

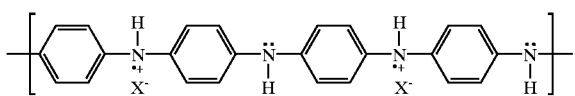

wherein, $X^-$ is an anion of an acid.

A doped polyaniline may be mixed with a polyimide precursor in a weight ratio ranging from 2:98 to 95:5, and the resulting mixture is dissolved in a solvent to a concentration ranging from 0.5 to 10 wt %, wherein the use of a weak basic solvent such as N-methyl-2-pyrrolidone, dimethylacetic acid and dimethylsulfoxide(DMSO) is preferred.

The doped polyaniline/polyimide precursor solution thus prepared is coated on an anode by a conventional wet process such as spin coating at 500 to 8,000 rpm for 1 to 5 minutes. The coating layer is then dried at 30 to 100° C. for 30 minutes or longer and subjected to thermal imidization at 100 to 600° C. for 1 hour or longer or by UV irradiation.

A doped polyaniline may also be dispersed in a polyetherimide in a weight ratio ranging from 5:95 to 80:20. A doped polyaniline/polyetherimide mixture having a suitable weight ratio is dissolved in a solvent such as chloroform to a concentration ranging from 0.5 to 10 wt % to prepare a coating solution, which is coated on an anode by a conventional wet process such as spin coating at 500 to 8,000 rpm for 1 to 5 minutes. The coating layer is then dried at 30 to 100° C. for 30 minutes or longer.

The thickness of the hole transport layer ranges from 20 to 100 nm.

Organic Luminescent Layer

The organic luminescent layer of the present invention comprises a polyimide of formula(I) having an electroluminescent moiety, or a mixture of a polyimide of formula(I) with a conventional electroluminescent material. Exemplary electroluminescent materials include tris(8-hydroxyquinolinolato) aluminum($Alq_3$), 1,1,4,4-tetraphenyl-1,3-butadiene(TB), oligophenylenevinylene derivatives, 4-(dicyanomethylene)-2-methyl-6-(4-dimethylaminostyryl)-4H-pyran(DCM), 1,4-distyrylbenzene, anthracene, tetracene, pentacene, coronene, perylene, pyrene, bis(8-quinolinolato) zinc(II), 9,10-diphenylanthracene, tris(4,4,4-trifluoro-1-(2-thienyl)-1,3-butanediono)-1,10-phenanthroline europium(III), tris(2,4-pentanediono)-1,10-phenanthroline terbium(III) and tris(4,4,4-trifluoro-1-(2-thienyl)-1,3-butanediono)-1,10-phenanthroline dysprosium(III).

The electroluminescent material may be dispersed in a soluble polyetherimide of formula(II) in a weight ratio ranging from 5:95 to 70:30. When the weight ratio is less than 5:95, the hole transporting and electron confining abilities of the device becomes lower and when the weight ratio is more than 70:30, the surface of the layer thus formed is not uniform. An electroluminescent material/polyetherimide mixture is dissolved in a solvent such as chloroform, methylene chloride and chloroethane to a concentration ranging from 0.3 to 10 wt % to prepare a coating solution.

The electroluminescent material/polyetherimide coating solution thus prepared is coated on an anode, or, when a hole transport layer is employed, on the surface of the hole transport layer by a conventional wet process such as spin coating. For example, the solution is coated at 500 to 8,000 rpm for 1 to 5 minutes and then, the resulting coating is dried at 30 to 100° C. for 30 minutes to 2 hours to form an electroluminescent layer.

Further, when a polyimide precursor is used in the organic luminescent layer, a mixture of the electroluminescent material and a polyimide precursor having a weight ratio ranging from 5:95 to 70:30 is dispersed in a solvent such as N-methyl-2-pyrrolidone, dimethylacetamide and dimethylformamide.

The electroluminescent material/polyimide precursor coating solution thus prepared is coated on an anode, or, when a hole transport layer is employed, on the surface of the hole transport layer by a conventional wet process such as spin coating. For example, the solution is coated at 500 to 8,000 rpm for 3 minutes or longer and then, the resulting coating is dried at 40 to 100° C. for 1 hour or longer, and then subjected to thermal imidization at 100 to 600° C. for 1 to 2 hours or to UV irradiation to form an organic luminescent layer.

The thickness of the organic luminescent layer ranges from 10 to 200 nm. The turn-on voltage of the present electroluminescent device can be controlled by varying the thickness of the organic luminescent layer.

Electron Transport Layer

The electron transport layer of the present invention comprises a polyimide of formula(I) having a moiety capable of electron transporting, or a mixture of a polyimide of formula(I) with a conventional electron transport agent such as oxygen-containing material. Exemplary electron transport agents include oxadiazole derivatives such as 2-(4-biphenyl)-5-(4-tert-butylphenyl)-1,3,4-oxadiazole and imide derivatives. The electron transport layer may be formed on the organic luminescent layer either by vapor-depositing an electron transport agent or by coating a layer of an electron transport agent dispersed in a polyimide matrix, in accordance with the procedures used in the preparation of the organic luminescent layer.

Multiple-Layer Structure

As mentioned above, the organic layer of the inventive electroluminescent device comprising an organic luminescent material, hole transport agent and/or electron transport agent may be in the form of a single layer or multiple layers.

For example, a hole transport agent and electroluminescent material may be incorporated in one organic layer by coating a mixture of polyetherimide, hole transport agent and electroluminescent material on an anode to form a hole transport/organic luminescent layer.

Further, organometallic compounds such as tris(8-hydroxyquinolinolato) aluminum($Alq_3$) which have both electroluminescent and electron transporting abilities may be dispersed in a polyimide matrix by a procedure similar to that used in the preparation of organic luminescent layer to form a single layer of organic luminescent/electron transport layer.

Also a small amount of an electroluminescent material may be added to the hole transport layer so that can be readily injected into the organic luminescent layer when the device is in operation. Further, when an electron transport layer is employed in the electroluminescent device of the present invention, an organic luminescent material may be added to the electron transport layer in order to improve the interface contact.

Referring to FIG. 1, the electroluminescent device in accordance with one aspect of the present invention comprises a transparent substrate(1), a transparent electrode layer(2), polyimide buffer layers(3, 7), a hole transport layer(4), an organic luminescent layer(5), an electron transport layer(6) and a metallic electrode(8). The electric power may be an alternative current or direct current.

Preferred Embodiments

The preferred embodiments of the present invention are as follows:

An electroluminescent device in accordance with the present invention the organic interlayer is comprised of an organic luminescent layer, and a hole transport layer containing a hole transport agent selected from the group consisting of N,N'-diphenyl-N,N'-bis(3-methylphenyl)-1,1'-diphenyl-4,4'-diamine(TPD), poly(N-vinylcarbazole) and a mixture thereof and a polyetherimide of formula(II) in a weight ratio ranging from 10:90 to 90:10;

An electroluminescent device in accordance with the present invention wherein the organic luminescent layer contains an organic luminescent material and a polyetherimide of formula(II) in a weight ratio ranging from 5:95 to 70:30;

An electroluminescent device in accordance with the present invention wherein the organic interlayer is comprised of an organic luminescent layer, and a hole transport layer containing the three elements of a polyetherimide of formula(II), a hole transport agent and an organic luminescent material in a weight ratio ranging from 4:3:3 to 5:4:1;

An electroluminescent device in accordance with the present invention wherein the organic interlayer is comprised of an organic luminescent layer, and a hole transport layer prepared by coating a mixture of an acid-doped polyaniline and a polyimide precursor in a weight ratio ranging from 2:98 to 95:5 to form a coating layer and then subjecting the coating layer to thermal imidization;

An electroluminescent device in accordance with the present invention wherein the organic interlayer is comprised of an organic luminescent layer, and a hole transport layer containing an acid-doped polyaniline and a polyetherimide of formula(II) in a weight ratio ranging from 5:95 to 80:20;

An electroluminescent device in accordance with the present invention wherein the organic luminescent layer is prepared by coating a mixture of an organic luminescent material and a polyimide precursor in a weight ratio ranging from 2:98 to 95:5 to form a coating layer and then subjecting the coating layer to thermal imidization;

An electroluminescent device in accordance with the present invention wherein the organic interlayer is comprised of a hole transport layer containing a hole transport agent and a polyetherimide of formula(II) in a weight ratio ranging from 5:95 to 70:30, and an organic luminescent layer containing an organometallic compound having both luminescent and electron transport activities and a polyetherimide of formula(II) in a weight ratio ranging from 5:95 to 70:30; and An electroluminescent device in accordance with the present invention wherein the organic interlayer is comprised of a hole. transport layer prepared by coating a mixture of a doped polyaniline and a polyimide precursor in a weight ratio ranging from 2:98 to 95:5 to form a coating layer and then subjecting the coating layer to thermal imidization, and an organic luminescent layer containing an organic luminescent agent and a polyetherimide of formula (II) in a weight ratio ranging from 5:95 to 70:30.

In practicing the present invention, one or more additional polyimide buffer layers may be coated on the anode and/or before coating the cathode in order to reduce the contact resistance as well as to improve adhesion between metal and organic layers. Further, the electroluminescent device of the present invention may be packaged with a suitable resin, thereby increasing its stability via protection against air and moisture.

In electroluminescent device of the present invention having a single or multiple organic layers, a polyimide layer can be utilized in one or more organic layers to increase the stability, luminous efficiency and lifetime of the device. Particularly, when the organic interlayer is in the form of polyimide/polyimide double layer, the physical stability of the device can be greatly improved. Further, the emitted light can be shifted to a shorter wavelength by controlling either the amount of organic luminescent material dispersed in a polyimide or the applied voltage.

The electroluminescent device of the present invention can be prepared by a conventional wet process in the form of a flat panel display. Further, when one or more polyimide layers are used in all organic layers together with a flexible electrodes, a flexible display may be also manufactured. Also, the organic layers of the present invention may be applied to solar cells, field effect transistors, photodiodes, photorefractive optical memory device and the like.

The present invention is further described and illustrated in Examples, which are, however, not intended to limit the scope of the present invention.

EXAMPLE 1

Indium tin oxide(ITO) was coated on a glass substrate to form a transparent anode layer.

N,N-diphenyl-N,N'-bis(3-methylphenyl)-1,1'-diphenyl-4,4'-diamine(TPD) and polyether-imide(PEI) were dispersed in chloroform in a weight ratio of 50:50 to obtain a 0.5wt % TPD/PEI solution. This TPD/PEI solution was coated on the transparent ITO anode layer and dried to form a hole transport layer having a thickness of 60 nm.

Tris(8-hydroxyquinolinolato) aluminum($Alq_3$) was vapor deposited on the hole transport layer to form an organic luminescent/electron transport layer having a thickness of 10 nm.

Then, magnesium is vapor deposited on the organic luminescent/electron transport layer under a pressure of $2 \times 10^{-6}$ torr to form a cathode layer, followed by vapor depositing indium on the cathode layer to form a conducting protective layer.

The wavelength of the emitting light was 520 nm; and the turn-on voltage and operation voltage of the device were 9V and 9–15V, respectively.

EXAMPLE 2

ITO was coated on a glass substrate to form a transparent anode layer.

N,N'-diphenyl-N,N'-bis(3-methylphenyl)-1,1'-diphenyl-4,4'-diamine(TPD) and polyether-imide(PEI) were mixed in a weight ratio of 50:50 and the mixture was stirred in chloroform for 24 hours to obtain a 1.0 wt % TPD/PEI solution. This TPD/PEI solution was spin-coated on the transparent ITO anode layer at 4,000 rpm for 3 minutes. The coated thin layer was dried at a temperature ranging from 45 to 50° C. a for 1 hour to form a hole transport layer having a thickness of 40 nm.

Tris(8-hydroxyquinolinolato) aluminum($Alq_3$) and polyetherimide(PEI) was mixed in a weight ratio of 30:70 and the mixture was stirred in chloroform for 24 hours to obtain a 0.5 wt % $Alq_3$/PEI solution. This solution was spin-coated on the transparent ITO anode layer at 3,000 rpm for 3 minutes. The coated thin layer was dried at 50° C. for 1 hour to form an organic luminescent/electron transport layer having a thickness of 25 nm.

Then, aluminum is vapor deposited on the organic luminescent/electron transport layer under a pressure of 10–6 torr to form a cathode layer having a thickness of 500 nm.

The wavelength of the emitting light was 520 nm; and the turn-on voltage and operation voltage of the device were 9V and 9–14V, respectively.

EXAMPLE 3

ITO was coated on a glass substrate to form a transparent anode layer.

Polyetherimide(PEI) of formula(II) having a molecular weight of 45,000, N,N-diphenyl-N,N'-bis(3-methylphenyl)-1,1'-diphenyl-4,4'-diamine(TPD) and tris(8-hydroxyquinolinolato) aluminum($Alq_3$) were mixed in a weight ratio of 50:40:10. The resulting mixture was stirred in chloroform for 24 hours to obtain a 0.5 wt % TPD+$Alq_3$/PEI solution. This TPD+$Alq_3$/PEI solution was spin-coated on the transparent ITO anode layer at 5,000 rpm for 1 minute. The coated thin layer was dried at 60° C. for 1 hour to form a hole transport layer having a thickness of 30 nm.

Tris(8-hydroxyquinolinolato) aluminum($Alq_3$3) was vapor-deposited on the hole transport layer to form an organic luminescent/electron transport layer.

Then, aluminum is vapor deposited on the organic luminescent/electron transport layer under a pressure of $10^{-6}$ torr to form a cathode layer having a thickness of 400 nm.

The wavelength of the emitting light was 520 nm; and the turn-on voltage and operation voltage of the device were 9V and 9–12V, respectively.

EXAMPLE 4

ITO was coated on a glass substrate to form a transparent anode layer.

Polyaniline emeraldine base(PANI) was doped with dodecylbenzenesulfonic acid(DBSA) dissolved in N-methyl-2-pyrrolidone to obtain a doped polyaniline(PANI-DBSA). The doped polyaniline (PANI-DBSA) was mixed with polyetherimide(PEI) in a weight ratio of 50:50, and stirred in chloroform for 24 hours to obtain a 0.5 wt % PANI-DBSA/PEI solution. This PANI-DBSA/PEI solution was spin-coated on the transparent ITO anode layer at 5,000 rpm for 90 seconds. The coated thin layer was dried at 60° C. for 1 hour to form a hole transport layer having a thickness of 50 nm.

Tris(8-hydroxyquinolinolato) aluminum($Alq_3$) was vapor-deposited on the hole transport layer under a pressure of $5 \times 10^{-6}$ torr to form an organic luminescent/electron transport layer having a thickness of 10 nm.

Then, aluminum is vapor deposited on the organic luminescent layer under the pressure of $5 \times 10^{-6}$ torr to form a cathode layer having a thickness of 500 nm.

The wavelength of the emitting light was 520 nm; and the turn-on voltage and operation voltage of the device were 6V and 6–9V, respectively.

EXAMPLE 5

ITO was coated on a glass substrate to form a transparent anode layer.

Polyaniline emeraldine base(PANI) was doped with dodecylbenzenesulfonic acid(DBSA) dissolved in N-methyl-2-pyrrolidone to obtain a doped polyaniline(PANI-DBSA).

4,4-oxyphenylenediamine and pyromellitic dianhydride were reacted at 25° C. for 48 hours to form a polyimide precursor, i.e., poly(amic acid) having formula (III).

The doped polyaniline(PANI-DBSA) and poly(amic acid) (PAA) were mixed in a weight ratio of 20:80 and stirred in N-methyl-2-pyrrolidone to obtain a 1 wt % PANI-DBSA/PAA solution. This PANI-DBSA/PAA solution was spin-coated on the transparent ITO anode layer at 5,000 rpm for 3 minutes. The coated thin layer was subjected to thermal imidization at 200° C. for 1 hour to form a hole transport layer having a thickness of 60 nm.

Tris(8-hydroxyquinolinolato) aluminum($Alq_3$) was vapor-deposited on the hole transport layer at a rate of 0.02 nm/sec under a pressure of $5 \times 10^{-6}$ torr to form an organic luminescent/electron transport layer having a thickness of 5 nm.

Then, aluminum is vapor deposited on the organic luminescent layer under a pressure of $5 \times 10^{-6}$ torr to form a cathode layer having the thickness of 300 nm.

The wavelength of the emitting light was 520 nm; and the turn-on voltage and operation voltage of the device were 4V and 4–8V, respectively.

EXAMPLE 6

ITO was coated on a glass substrate to form a transparent anode layer.

N,N-diphenyl-N,N'-bis(3-methylphenyl)-1,1'-diphenyl-4,4'-diamine(TPD) and poly(amic acid)(PAA) of formula(III) prepared in Example 5 were mixed in a weight ratio of 30:70. The resulting mixture was dissolved in dimethylformamide to obtain a 1 wt % TPD/PAA solution. This solution was spin-coated on the transparent ITO anode layer at 3,000 rpm for 3 minutes. The coated thin layer was dried at 83° C. for 1 hour, and then, subjected to thermal imidization at 2000° C. for 1 hour to form a hole transport layer having a thickness of 40 nm.

Perylene and polyetherimide(PEI) were mixed in a weight ratio of 30:70 and stirred in chloroform for 24 hours to obtain a 1 wt % perylene/PEI solution. The resulting solution was spin-coated on the hole transport layer at 3,000 rpm for 3 minutes and dried at 47° C. for 1 hour to form an organic luminescent transport layer having a thickness of 35 nm.

Then, aluminum is vapor deposited on the organic luminescent layer under a pressure of $10^{-6}$ torr to form a cathode layer having a thickness of 300 nm.

The wavelength of the emitting light were 520 and 610 nm; and the turn-on voltage and operation voltage of the device were 9V and 15–19V, respectively.

EXAMPLE 7

ITO was coated on a glass substrate to form a transparent anode layer.

1,1,4,4-tetraphenyl-1,3-butadiene(TB) and polyetherimide(PEI) were mixed in a weight ratio of 50:50. The resulting mixture was dissolved in chloroform to obtain a 2.0 wt % TB/PEI solution. This solution was spin-coated on the transparent ITO anode layer at 3,000 rpm for 3 minutes. The coated thin layer was dried at 50° C., for 1 hour to form an organic luminescent layer having a thickness of 100 nm.

The wavelength of the emitting light was 440 nm; and the turn-on voltage and operation voltage of the device were 12V and 13V, respectively.

EXAMPLE 8

ITO was coated on a glass substrate to form a transparent anode layer.

4-(dicyanomethylene)-2-methyl-6-(4-dimethylamino-styryl)-4H-pyran(DCM) and polyether-imide(PEI) were mixed in a weight ratio of 50:50. The DCM/PEI mixture was dissolved in chloroform and the solution was spin-coated on the transparent ITO anode layer at 3,000 rpm for 3 minutes. The coated thin layer was dried at 50° C. for 1 hour to form an organic luminescent layer.

Then, aluminum is vapor deposited on the organic luminescent layer under a pressure of $5 \times 10^{-6}$ torr to form a cathode layer having the thickness of 300 nm.

The wavelength of the emitting light was 620 nm; and the turn-on voltage and operation voltage of the device were 10V and 10–15V, respectively.

EXAMPLE 9

ITO was coated on a glass substrate to form a transparent anode layer.

4-(dicyanomethylene)-2-methyl-6-(4-dimethylamino-styryl)-4H-pyran(DCM) and polyether-imide(PEI) were mixed in a weight ratio of 50:50. The DCM/PEI mixture was dissolved in chloroform and the solution was spin-coated on the transparent ITO anode layer at 2,000 rpm for 3 minutes. The coated thin layer was dried at 50° C. for 1 hour to form an organic luminescent layer having a thickness of 100 nm.

Then, aluminum is vapor deposited on the organic luminescent layer under a pressure of $5 \times 10^{-6}$ torr to form a cathode layer having a thickness of 300 nm.

The wavelength of the emitting light was 620 nm; and the turn on voltage was 16V.

EXAMPLE 10

ITO was coated on a glass substrate to form a transparent anode layer.

Perylene and polyetherimide(PEI) were mixed in a weight ratio of 40:60. The mixture was dissolved in chloroform and the solution was spin-coated on the transparent ITO anode layer at 3,000 rpm for 3 minutes. The coated thin layer was dried at 47° C. for 1 hour to form an organic luminescent layer having a thickness of 60 nm.

Then, aluminum is vapor deposited on the organic luminescent layer under a pressure of $5 \times 10^{-6}$ torr to form a cathode layer having a thickness of 400 nm.

The wavelength of the emitting light was 520/610 nm; and the turn-on voltage and operation voltage of the device were 6V and 6–10V, respectively.

EXAMPLE 11

ITO was coated on a glass substrate to form a transparent anode layer.

Tris (8-hydroxyquinolinolato) aluminum($Alq_3$) and poly (p-phenylene biphenyltetracaboxamic acid)(BPDA-PDA PAA) were mixed in a weight ratio of 50:50. The resulting mixture was dissolved in N-methyl-2-pyrrolidone. This solution was spin-coated on the transparent ITO anode layer at 2,500 rpm for 3 minutes. The coated-thin layer was dried at 83° C. for 4 hours, and then, subjected to thermal imidization at 250° C. for 1 hour to form an organic luminescent/electron transport layer having a thickness of 120 nm.

Then, magnesium and indium were sequentially vapor deposited on the organic luminescent layer under a pressure of $10^{-6}$ torr, to form a cathode layer.

The wavelength of the emitting light was 520 nm; and the turn-on voltage and operation voltage of the device were 18V and 18–21V, respectively.

EXAMPLE 12

Indium tin oxide(ITO) was coated on a glass substrate to form a transparent anode layer.

N,N-diphenyl-N,N'-bis(3-methylphenyl)-1,1'-diphenyl4, 4'-diamine(TPD) and polyether-imide(PEI) were dispersed in chloroform in a weight ratio of 50:50 to obtain a 0.5 wt % TPD/PEI solution. This TPD/PEI solution was coated on the transparent ITO anode layer at 5,000 rpm for 3 minutes and dried to form a hole transport layer having a thickness of 30 nm.

Tris(8-hydroxyquinolinolato) aluminum($Alq_3$) was vapor deposited on the hole transport layer to form an organic luminescent/electron transport layer having a thickness of 20 nm.

Then, aluminum is vapor deposited on the organic luminescent layer under a pressure of $5 \times 10^{-6}$ torr to form a cathode layer having a thickness of 300 nm.

The wavelength of the-emitting light was 520 nm.

Figure 2:
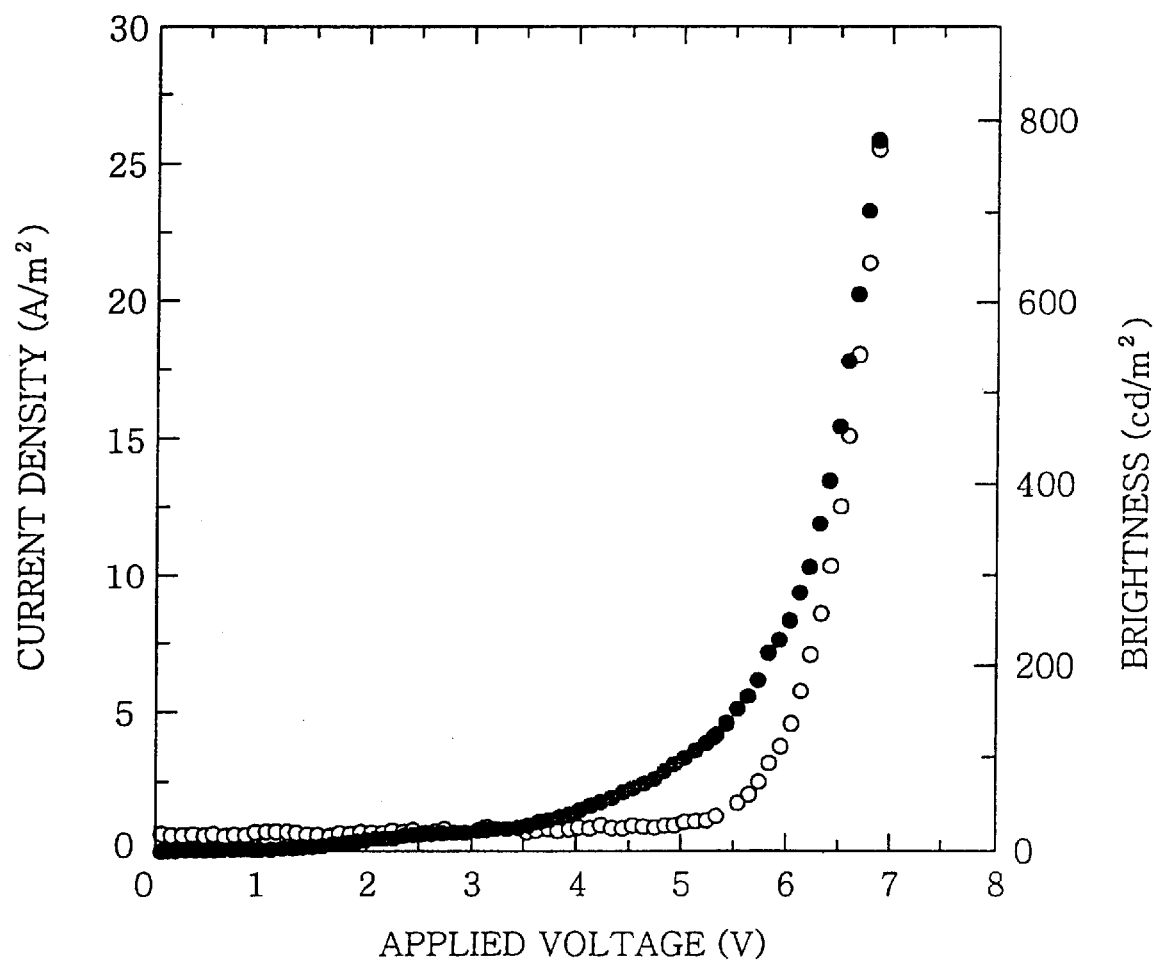
FIG. 2 demonstrates the variation of the current density (A/m$^2$)(●) and brightness(cd/m$^2$) (○) of the electroluminescent device of Example 12 as a function of the applied voltage (V)

FIG. 2 demonstrates the variation of the current density $(A/m^2)$(●) and brightness($cd/m^2$)(○) of the device of Example 12 with the applied voltage(V). The turn-on voltage and operation voltage of the device were 5.5V and 6.5–9V, respectively.

Figure 3:
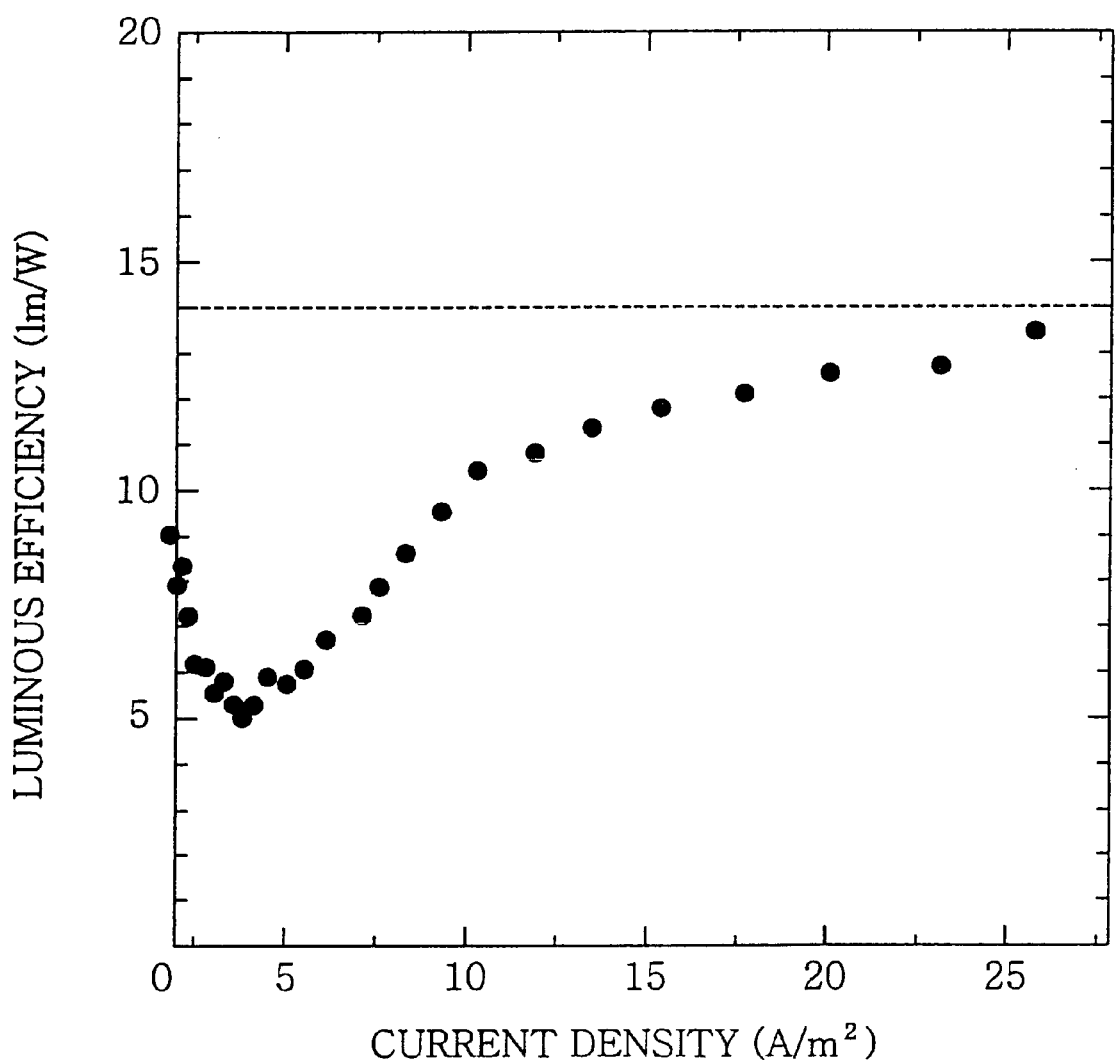
FIG. 3 exhibits the dependency of the luminous efficiency (lm/W) of the electroluminescent device of Example 12 on current density(A/m$^2$)

FIG. 3 shows the dependency of the luminous efficiency (lm/w) of the device of Example 12 on current density(A/$m^2$). It can be seen from the above result that the luminous efficiency of the device of Example 12 is 14 lm/W at an operating voltage of 6.5V. Thus, the device of the present invention has high luminous efficiency.

Figure 4:
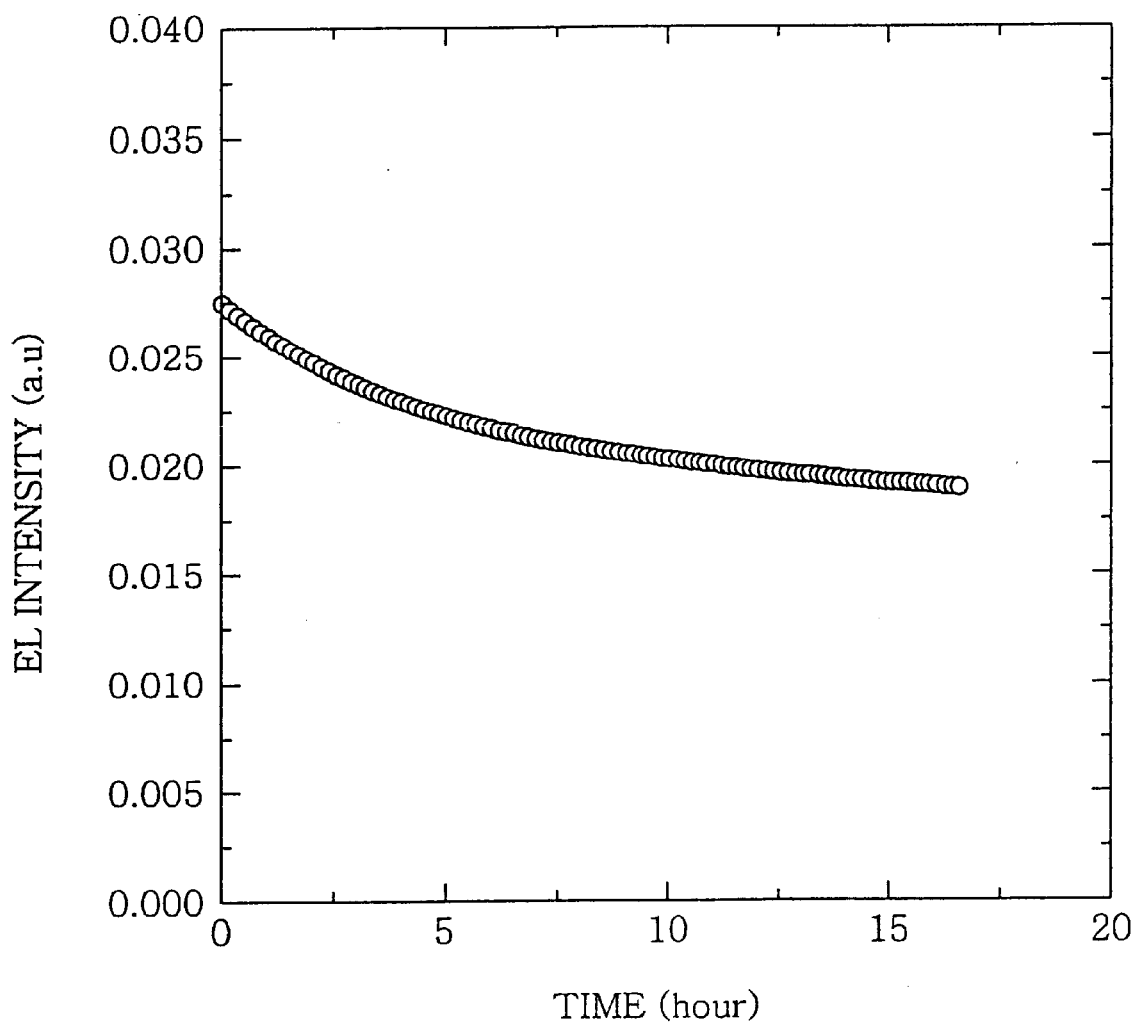
FIG. 4 depicts the change in light intensity of the electroluminescent device of Example 12 with time.

FIG. 4 presents the change in light intensity of the device of Example 12 with time at an applied voltage of 6.5V. The time required to reach the half intensity of the emitting light was estimated at 2,000 hours from FIG. 4. Therefore, the device of the present invention has excellent stability. It is considered that the lifetime is over 10,000 hours when the protective packaging is completed.

As can be seen from the above, the electroluminescent device of the present invention has the advantages of high emission stability, improved luminous efficiency and prolonged lifetime through introducing polyimide layer into device structure. It is also stressed again that the present invention is mainly focused on the use of polyimide. Thus, the lifetime can be further improved rather that the results of present examples. Therefore, the electroluminescent device of the present invention may be advantageously applied to solar cells, field effect transistors, photodiodes and the like.

While the embodiments of the subject invention have been described and illustrated, it is obvious that various changes and modifications can be made therein without departing from the spirit of the present invention which should be limited only by the scope of the appended claims.

What is claimed is:

1. An electroluminescent device comprising a transparent electrode layer, a metallic electrode layer, and an organic interlayer disposed between the electrode layers wherein the organic interlayer comprises an organic luminescent layer and a hole transport layer comprising an organic luminescent material and a hole transport agent, respectively, and at least one layer of the organic luminescent and hole transport layers contains a polyetherimide of formula (II'):

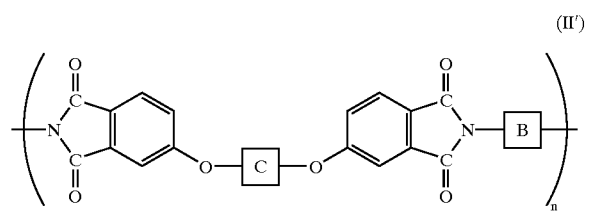

wherein, B is a moiety derived from a diamine compound selected from the group consisting of 4,4'-diaminodiphenylether, 4,4'-diaminodiphenylmethane, 2,2-bis(4-aminophenyl)propane, 3,5-diaminotoluene, 3,4'-diaminodiphenylether, 3,4'-diaminodiphenylmethane, 1,4-phenylene diamine, 3,3'-diaminodiphenylether, 3,3'-diaminodiphenylmethane, 2,5-dimethyl-p-phenylene diamine, 2,3,5,6-tetramethyl-p-phenylene diamine, 4,4'-diaminobenzophenone, 4,4'-diaminobiphenyl, 3,3'-diaminobenzophenone, 4,4'-diaminodiphenylsulfide, α,α'-bis(4-aminophenyl)-1,4-diisopropylbenzene, 2,2-bis[4-(4-aminophenoxy)phenyl]propane, 1,4-bis(4-aminophenoxy)benzene, 2,2-bis[4-(3-aminophenoxy)phenyl]hexafluoropropane, 2,6-diaminotoluene, 4,4'-diaminodiphenylsulfone, 3,3'-diaminodiphenylsulfone, 3,3'-bis(aminophenyl)-hexafluoropropane, 2,2'-bis(3-amino-4-hydroxylphenyl)hexafluoropropane, 4,4'-bis(2-chloroanilino)methane, 4,4'-bis(aminocyclohexyl)methane, 2,2'-bis(3-amino-4-methyl-phenyl)hexafluoropropane, 3,4'-diaminobenzophenone, 4,4'-diaminobibenzyl, 4,4'-bis(aminophenyl)hexafluoropropane, 1,3'-bis(m-aminophenoxy)benzene, 4,4'-methylene-bis-o-toluidine, 3,3'-diamino-4,4'-dihydroxybiphenyl, 4,4'-diaminooctafluorodiphenyl, 4,4'-bis(aminophenyl)selenide and 2,4-diamino-6-phenyl-1,3,5-triazine; n is an integer of 2 or higher; and C is

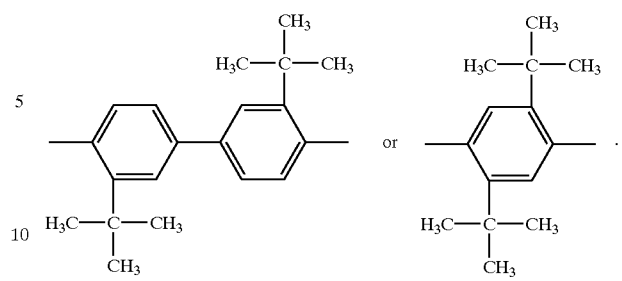

2. The electroluminescent device of claim 1 further comprising one or more buffer layers made of the polyetherimide of formula (II'), each buffer layer being arranged between the organic interlayer and one of the electrode layers.

3. The electroluminescent device of claim 1, wherein the organic luminescent layer contains an electroluminescent material selected from the group consisting of tris(8-hydroxyquinolinolato) aluminum, 1,1,4,4-tetraphenyl-1,3-butadiene, oligophenylenevinylene derivatives, 4-(dicyanomethylene)-2-methyl-6-(4-dimethylaminostyryl)-4H-pyran, 1,4-distyrylbenzene, anthracene, tetracene, pentacene, coronene, perylene, pyrene, bis(8-quinolinolato) zinc(II), 9,10-diphenylanthracene, tris(4,4,4-trifluoro-1-(2-thienyl)-1,3-butanediono)-1,10-phenanthroline europium(III), tris(2,4-pentanediono)-1,10-phenanthroline terbium(III), tris(4,4,4-trifluoro-1-(2-thienyl)-1,3-butanediono)-1,10-phenanthroline dysprosium(III) and a mixture thereof.

4. The electroluminescent device of claim 1, wherein the hole transport layer contains a hole transport agent selected from the group consisting of N,N'-diphenyl-N,N'-bis(3-methylphenyl)-1,1'-diphenyl-4,4'-diamine(TPD), poly(N-vinylcarbazole) and a mixture thereof.

5. The electroluminescent device of claim 1, wherein the hole transport layer contains a polyaniline doped with an acid selected from the group consisting of dodecylbenzenesulfonic acid, camphor sulfonic acid, benzenesulfonic acid, p-toluenesulfonic acid and 5-sulfosalicylic acid.

6. The electroluminescent device of claim 5, wherein the amount of the polyanilene doped with an acid ranges from 5 to 80 wt % based on the total weight of the hole transport layer.

7. The electroluminescent device of claim 1 wherein the organic interlayer further comprises an electron transport layer containing an electron transport agent selected from the group consisting of an oxadiazole derivative, an imide derivative and a mixture thereof.

8. The electroluminescent device of claim 1, wherein the organic interlayer is comprised of an organic luminescent layer, and a hole transport layer containing a hole transport agent selected from the group consisting of N,N'-diphenyl-N,N'-bis(3-methylphenyl)-1,1'-diphenyl-4,4'-diamine (TPD), poly(N-vinylcarbazole) and a mixture thereof and a polyetherimide of formula(II') in a weight ratio ranging from 10:90 to 90:10.

9. The electroluminescent device of claim 1, wherein the organic luminescent layer contains an organic luminescent material and a polyetherimide of formula(II') in a weight ratio ranging from 5:95 to 70:30.

10. The electroluminescent device of claim 1, wherein the organic interlayer is comprised of an organic luminescent layer, and a hole transport layer containing the three elements of a polyetherimide of formula(II'), a hole transport agent and an organic luminescent material in a weight ratio ranging from 4:3:3 to 5:4:1.

11. The electroluminescent device of claim 1, wherein the organic interlayer is comprised of an organic luminescent layer, and a hole transport layer containing an acid-doped polyaniline and a polyetherimide of formula(II') in a weight ratio ranging from 5:95 to 80:20.

12. The electroluminescent device of claim 1, wherein the organic interlayer is comprised of a hole transport layer containing a hole transport agent and a polyetherimide of formula (II') in a weight ratio ranging from 5:95 to 70:30, and an organic luminescent layer containing an organometallic compound having both luminescent and electron transport activities and a polyetherimide of formula (II') in a weight ratio ranging from 5:95 to 70:30.

* * * * *